United States Patent [19]

Komiya et al.

[11] 3,714,522

[45] Jan. 30, 1973

[54] SEMICONDUCTOR DEVICE HAVING SURFACE ELECTRIC-FIELD EFFECT

[75] Inventors: Yoshio Komiya, Tokyo, Japan; John L. Moll, Stanford, Calif.; Yasuo Tarui, Tokyo, Japan

[73] Assignee: Kogyo Gijutsuin (a/k/a)"Agency of Industrial Science and Technology, Ministry of International Trade and Industry, Japanese Government", Tokyo-to, Japan

[22] Filed: Nov. 13, 1969

[21] Appl. No.: 876,315

[30] Foreign Application Priority Data

Nov. 14, 1968 Japan ................................43/82815
Nov. 14, 1968 Japan ................................43/82816

[52] U.S. Cl...........317/235 R, 317/235 B, 317/235 N
[51] Int. Cl.................................................H01l 11/14
[58] Field of Search..........317/235; 307/304; 335/35

[56] References Cited

UNITED STATES PATENTS

| | | | |
|---|---|---|---|
| 3,328,601 | 6/1967 | Rosenbaum | 317/235 |
| 3,391,282 | 7/1968 | Kabell | 317/235 |
| 3,333,115 | 7/1967 | Kawakami | 317/235 |
| 3,449,645 | 6/1969 | Muller | 317/235 |
| 3,482,167 | 12/1969 | Kaplan et al. | 330/35 |

*Primary Examiner*—Jerry D. Craig
*Attorney*—Holman & Stern

[57] ABSTRACT

A semiconductor device comprising a semiconductor, an insulating layer and a resistive or half conducting layer which are provided on the surface of said semiconductor, and a metallic electrode adjoined to said latter layers and having such a surface electric-field effect as that any potential distribution is established on said insulating layer, said effect causing multiplication and increase of the functional ability of the semiconductor device, whereby for example, effective utilization of the device as an amplifier comprising a high frequency, surface electric-field effect transistor, a high speed switching transistor or tetrode is made possible.

Furthermore, a semiconductor device having the same structure as mentioned above except that the insulating layer and resistive layer or half conducting layers are made of a material capable of transmitting an input light ray therethrough and mutual interaction between the input light ray and said semiconductor is skillfully utilized for effective multiplication of the functional ability of the semiconductor device, whereby, for example, effective utilization of the device as a light detector, a surface photo transistor, a surface light generating element control of which is attained by gate voltage, or a surface light modulator is made possible.

9 Claims, 21 Drawing Figures

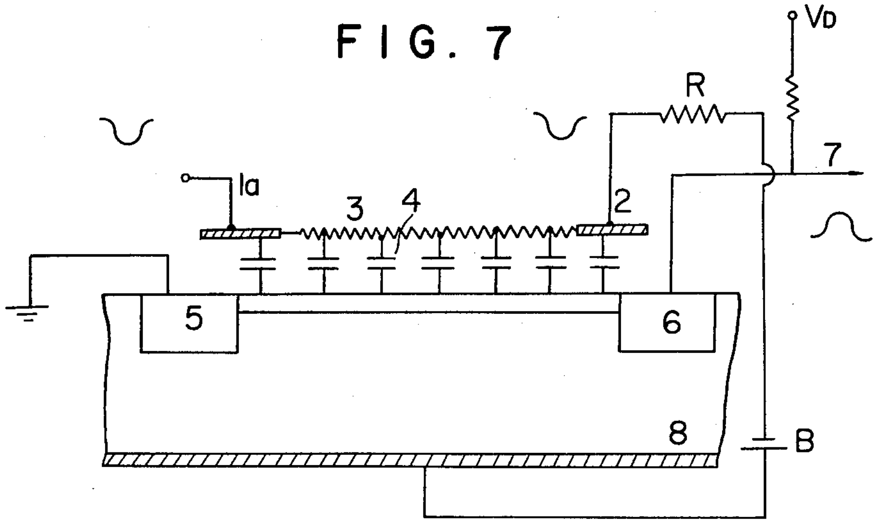
FIG. 8 (a)
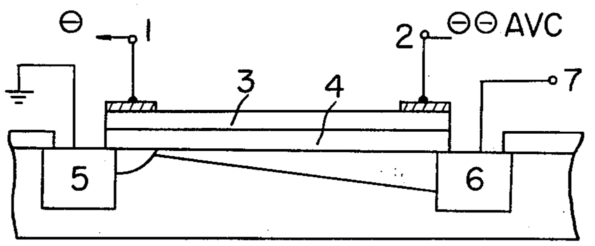
FIG. 8 (b)
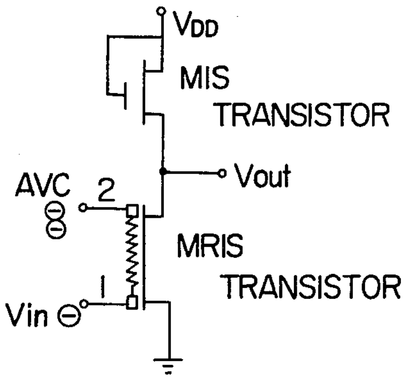

SEMICONDUCTOR DEVICE HAVING SURFACE ELECTRIC-FIELD EFFECT

BACKGROUND OF THE INVENTION

The present invention relates to a new semiconductor device having surface electric-field effects.

The so-called MIS transistor, in which an insulating layer is attached to a semiconductor surface and an effect imparted to said semiconductor surface by variation of a voltage applied from an electrode contacting with said insulating layer, has been well known. A principal structure of the MIS transistor is shown in FIG. 1, in which the transistor comprises a gate electrode 1, an insulating layer 4, highly doped regions 5 and 6 at source portion and drain portion, respectively, an output terminal 7 at the drain portion, a semiconductor substrate 8, and an inversion channel 9.

The MIS transistor is provided with a metallic electrode at gate portion, so that effect imparted to the semiconductor surface from the gate electrode causes uniform and constant potential distribution on said insulator surface. Accordingly, from viewpoint of relation with the potential distribution in the channel, the MIS transistor is compelled to take a structure such that a saturation occurs always at the position near the drain portion. However, if the structure of the MIS transistor can be made so that a saturation due to depletion of channel carrier occurs at any point in the channel, said point being remote from the drain portion near the source of the channel, and the channel is largely opened at the drain side from said point, said structure will become substantially equivalent to a structure channel of which has become short really, whereby a higher transconductance and convenience are obtained. For the purpose of obtaining the structure as mentioned above, it will be considered to be necessary to cause formation of any electric potential distribution along the surface of the gate electrode on the insulator. For example, a procedure of providing resistive or half conducting layer, besides the metallic electrode, at gate portion, applying an electric voltage from said metallic electrode contacting with said layer, and making a potential distribution caused by potential drop produced in said resistive layer to operate onto the semiconductor surface through an insulating layer beneath said the resistive layer can be adopted. According to structure mentioned just above, since a resistive layer having a high resistance is disposed between a metallic electrode and other metallic electrode, two gate metallic electrodes are mutually separated from high frequency point of view, but are connected to each other from d.c. point of view, thus causing very favorability of decreasing the feed-back capacity.

Considering the above-mentioned fact, the inventors of this invention have proposed to provide a resistive or half conducting layer, besides an insulating layer, on the surface of the semiconductor and to apply a voltage from a metallic electrode adjoining with said resistive layer so as to produce a potential drop in said layer, whereby a surface electric-field effect type semiconductor device having any potential distribution on the insulating layer of the semiconductor surface is obtained.

Furthermore, conventional light modulators, light detectors and light emitting devices have various inconveniences and disadvantages. However, the inventors of this invention have found that vary effective light modulators, light detectors, and light emitting devices can be obtained by modifying the above-mentioned new semiconductor device of surface electric-field effect type by utilizing skillfully modulation by gate electrode and effecient interaction between light and the carrier of the channel or the depletion layer under the channel or the surface induced junction.

SUMMARY OF THE INVENTION

Therefore, it is an essential object of the invention to provide a semiconductor device having such a surface electric-field effect as that any potential distribution can be established on an insulator layer provided on the surface of a semiconductor substrate, said effect causing multiplication and increase of the functional ability of the semiconductor device.

It is another object of the invention to provide a semiconductor device having such a surface electric-field effect as mentioned above, in which mutual interaction between an input ray and said semiconductor is skillfully utilized for causing effective multiplication of the functional ability of the semiconductor device.

The above objects and other objects as well as characteristic feature and functions of the invention will be apparent from the following description taken in connection with the accompanying drawings, in which the same or equivalent numbers are designated by the same reference numerals and characters.

BRIEF DESCRIPTION OF THE DRAWINGS

FIG. 7 is a schematic side view of a principal structure of a transistor type delay element according to the invention;

FIG. 8 (*a*) is a schematic side view showing structure of a MRIS transistor according to the invention;

FIG. 8 (*b*) is an equivalent circuit showing a MRIS transistor type amplifier having MIS transistor as its load;

FIG. 9 (*b*) is an equivalent circuit diagram showing an amplifier utilizing the MIRS transistor shown in FIG. 9 (*a*), said amplifier having as its load a MIS transistor;

FIG. 9 (*c*) shows characteristic relation between output voltage and input voltage of the amplifier shown in FIG. 9 (*b*), the characteristics is changed by the input photo electric signal;

DETAILED DESCRIPTION OF THE INVENTION

Figure 2:
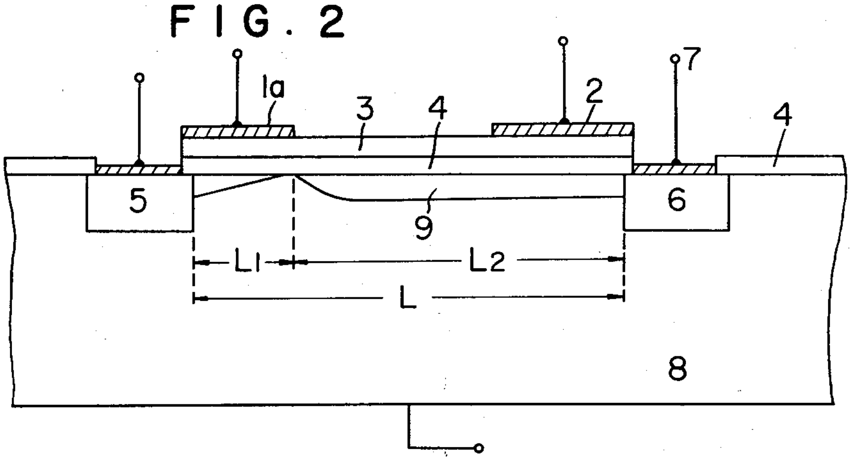
FIG. 2 is a schematic side view, in section, for showing a structure of MRIS transistor according to the invention.

The semiconductor device shown in FIG. 2 relates to an example of the invention, said example being a transistor having surface electric-field effect and utilizing a resistive or a half conducting layer. This type transistor will be referred to MRIS transistor (Metal-Resistive layer-Insulator-semiconductor transistor) hereinafter.

Figure 1:
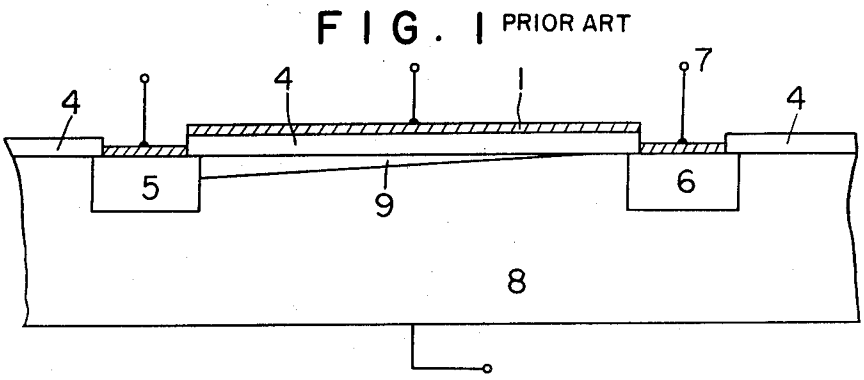
FIG. 1 PRIOR ART
FIG. 1 is a schematic side view, in section, for showing a principal structure of the conventional MIS transistor.

Referring to FIG. 2; the device comprises numbers 4, 5, 6, 7, 8 and 9 corresponding, respectively, to the members 4, 5, 6, 7, 8 and 9 in the device of FIG. 1, a first gate electrode 1*a*, a second gate electrode 2, and a resistive layer 3. As should be apparent, source 5 and drain 6 are of opposite conductivity type than substrate 8. In FIG. 2, L represents distance between the source and drain, that is, length of the channel, $L_1$ represents length of the channel beneath the first gate electrode 1*a*, and $L_2$ represents length of $(L - L_1)$. In the device of FIG. 2, it is required to select the material of the resistive or half conducting layer 3 so that resistance thereof is sufficiently lower than that of the insulating layer 4, but is sufficiently large so as to make the consumed electric power due to electric current flowing through between the first and second gate electrode, exists substantially within a predetermined allowable range. Accordingly, value of the resistance of the resistive layer 3 differs depending upon the application object of the device. When the MRIS transistor is to be used to improve functional ability of the conventional MIS transistor so as to cause higher transconductance and lower drain-gate feed-back capacitance than said MIS transistor, the voltage $V_{G2}$ applied to the second gate electrode is to be maintained at a constant value which is sufficiently larger than the voltage $V_{G1}$ applied to the first gate electrode. Now, let it be assumed that operation of the device is considered at the condition mentioned above. In this case, the channel at the portion except the first gate electrode is opened more largely than the first gate electrode portion, so that it may be considered that the drain voltage $V_D$ of the terminal 7 is substantially applied to the channel $L_1$ beneath the first gate electrode. That is, if the channel beneath the first gate electrode is used as the saturation region of the conventional MIS transistor, the channel portion corresponding to length $(L_1 + L_2)$ in FIG. 2 can be used as if it has the same function as MIS-field effect transistor having channel length $L_1$ which is remarkably shorter than the length $(L_1 + L_2)$.

With reference to FIG. 2, such device can, for purposes of illustration, be described as an embodiment of an N channel device wherein source 5 and drain 6 are of an $n^+$ region, and substrate 8 is of a P type. A positive drain supply voltage $V_D$ is applied to drain terminal 7. The gate voltages $V_{G1}$ through $V_{th}$ are positive in value. If insulating 4 is of a thermally oxidized $SiO_2$, the device of FIG. 2 would be in a depletion mode. On the other hand, if the insulating layer 4 is made of $Al_2O_3$, the channel of the device normally would be in the off state and the device would operate in an enhancement mode, as should be apparent to those skilled in the art.

According to theory of the conventional MIS transistor, there is the following quantity $(G_{ms}/C_{in})$ representing the figure of merits of the MIS transistor.

$$(G_{ms}/C_{in}) = (\mu/L^2)(V_G - V_{th}),$$

where $G_{ms}$, $C$, $V_G$, $V_{th}$, and $\mu$ represent, respectively a transconductance at saturation region, an input gate capacity, a gate voltage, a threshold voltage, and a surface mobility. As clear from the above equation, capability of shortening really the length L of the channel means that it is possible to use the MRIS transistor at a higher frequency region than the normal cases. On the other hand, it is well known that in the conventional MIS transistor the length L of the channel is limited to about 5 $\mu$ or more from viewpoints relating to manufacturing conditions such as diffusion of source and drain, limit of photoetching at the gate portion and the like. In order to cause operation of the MRIS transistor according to the principle mentioned above, the following conditions (1) and (2) are necessary.

(1) $V_{G_2} \gg V_{G_1}$ (2) Drain voltage $V_D$ is set so that transistor at the portion of the first gate voltage $V_{G_1}$ is always within saturation region.

That is, the necessary condition is that at the end of the channel length $L_1$ of the first gate transistor, channel potential $V_{D_1}$ is always larger than $(V_{G_1} - V_{th})$. For this purpose, it is necessary to calculate the drain voltage $V_D$ adapted for satisfying the necessary condition mentioned above. The following equation (1) can be approximately utilized.

$$\beta_R(V_{G_1} - V_{th})^2 = 2(V_D - V_{G_1} + V_{th})(V'_{G_2} - V_{th} - \Delta V_{th}) - V^2_D + (V_{G_1} - V_{th})^2 \quad (1)$$

$$\beta_R = (\beta_1/\beta_2) \quad \beta_1 = (W \epsilon_{ox} \mu / L_1 t_{ox}), \quad \beta_2 = (W \epsilon_{ox} \mu / L_2 t_{ox}),$$

where $\Delta V_{th}$, $W$, $\epsilon_{ox}$, $\mu$, $t_{ox}$, and $V'_{G_2}$ represent, respectively, variation component of threshold voltage due to bulk effect of the subsrate, width of the channel, dielectric constant of the insulating layer, the mobility of the channel carrier, thickness of the insulating layer, and voltage which is equal to a kind of mean voltage between $V_{G_2}$ and $V_{G_1}$.

Figure 3:
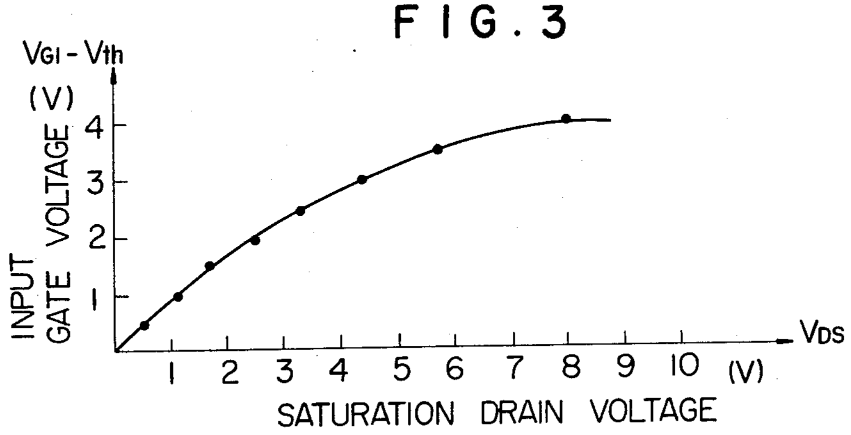
FIG. 3 is a characteristic curve showing relation between a first gate voltage and a minimum drain saturation voltage in the MRIS high frequency transistor.

The result of the equation 1 is shown in FIG. 3, in which $V_{DS}$ in abscissa and $(V_{G_1} - V_{th})$ in vertical axes represent, respectively, saturation drain voltage and input gate voltage. In the equation 1, the relation between the saturation channel $V_{D_1}$ of the first gate transistor and the drain voltage $V_D$ has been calculated in the form of $V_{D_1} = V_{G_1} - V_{th}$.

According to the structure of FIG. 2, at the channel portion except the first gate portion, the gate voltage increases from $V_{G_1}$ to the voltage $V_{G_2}$ while being varied at some positions. Accordingly, if consideration is made by adopting a kind of mean value, the value $V'_{G_2}$ in the equation 1 varies in accordance with length of the portion corresponding to the second gate electrode 2 within the channel length $L_2$. At any rate, since it is considered that the channel portion except the first gate portion is in a state applied with minimum gate voltage $V_{G_1}$ and maximum gate voltage $V_{G_2}$, an appropriate estimation can be obtained by setting the voltage $V'_{G_2}$ so as to be a kind of mean value between said voltages $V_{G_1}$ and $V_{G_2}$.

For example, in the case of FIG. 3, it will be understood that saturation value of the minimum drain voltage at the time when the first gate input voltage is applied can be calculated by use of the equation 1. In this case, $$(L_2/L_1) = 2, \quad V'_{G_2} - V_{th} - \Delta V_{th} = 10\ V$$

Figure 4:
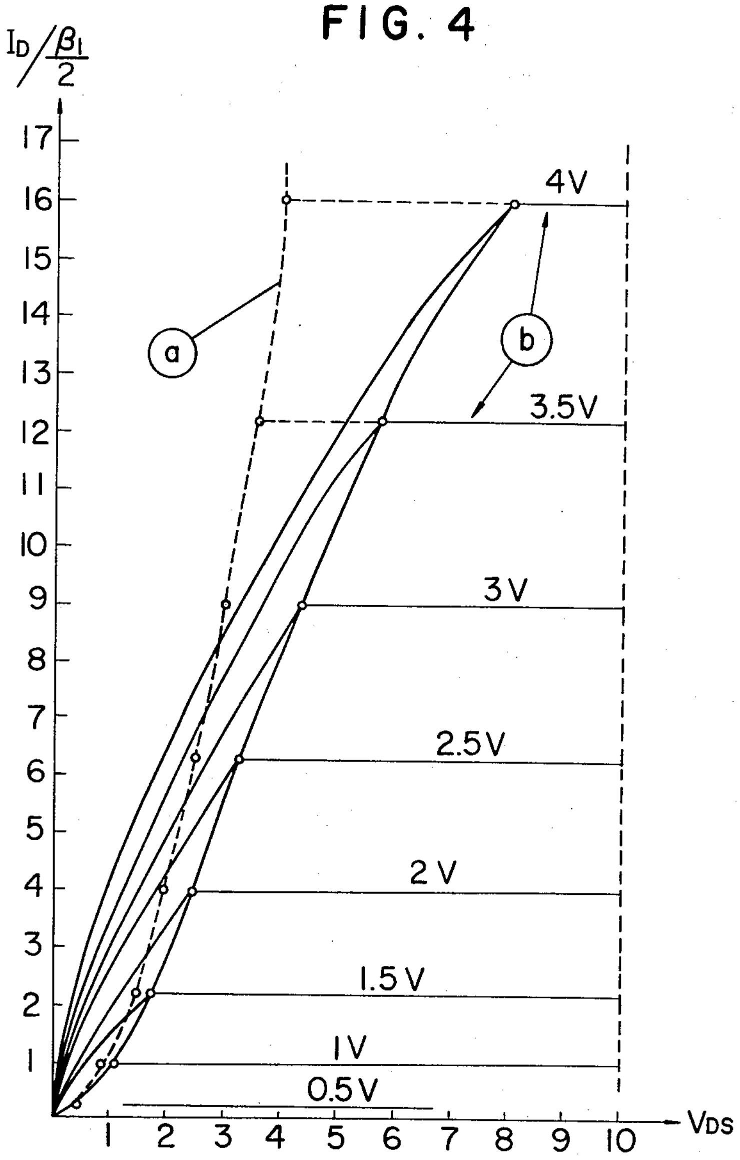
FIG. 4 shows static characteristics of the MRIS transistor.

At this case, the static characteristics of the MRIS transistor become as shown in FIG. 4. In the plotting of FIG. 4, the following data were adopted.

$V'_{G_2} - V_{th} - \Delta V_{th} = 10V$
$(L_2/L_1) = 2$
$I_{DS} = (\beta 1/2)\,(V_{G_1} - V_{th})^2$, wherein $I_{DS}$ represents value of the saturation drain current. Furthermore, in FIG. 4,ⓐ,ⓑ and $I_D$ $\beta 1/2$ represent, respectively, boundary of the saturation region of the MIS transistor having channel length $L_1$, first gate voltage, and the drain current.

In the MRIS transistor as illustrated in FIG. 2, operation and effect obtained in the case when a bias potential higher than saturation drain voltage obtained by the equations mentioned above is applied will be considered in the following.

Since the channel length $(L_1 + L_2)$ can be considered as if it were identical to the saturation MIS transistor having channel length $L_1$, the transconductance $G_{ms}$ of the device can be represented by the following equation:

$$G_{ms} = \beta_1 (V_{G_1} - V_{th})$$

Figures 5A, 5B:
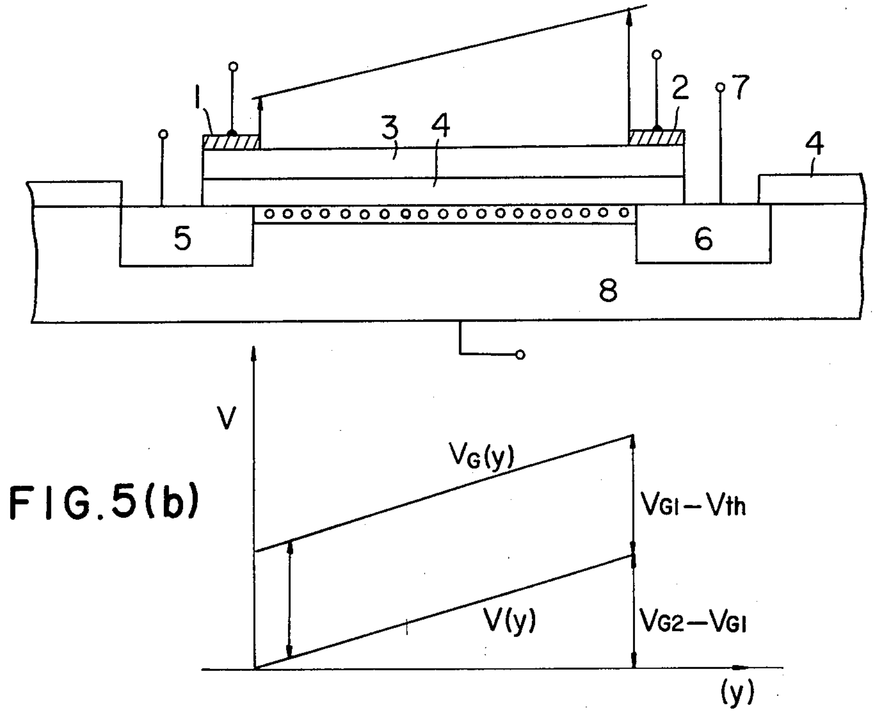
FIG. 5 (*a*), (*b*), and (*c*) show, respectively, a structure manufactured according to the invention and having linear type gate voltage distribution electric-field effect, a characteristic diagram showing relation between a channel potential distribution and a gate potential distribution in the case where a specific bias is applied to said transistor, and a characteristic diagram showing uniform channel carrier distribution in the channel of said transistor.
Figure 5C:
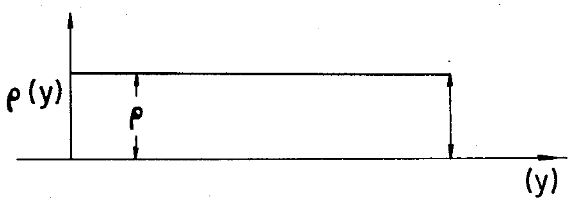

Furthermore, advantageously, it may be considered that from high frequency point of view the second gate having the voltage $V_{G_2}$ and the first gate having the voltage $V_{G_1}$ are separated from each other by means of a resistive layer 3, so that feed-back of a signal from drain to gate $1_a$ in the conventional MIS transistor can be protected from feed-back of a signal by the second gate portion which is grounded in AC sense of view. Furthermore, another advantage resides in that since a saturation region is formed at portion corresponding to channel length $L_1$, the channel near the drain portion to which a high voltage is applied for does not include a high electric field portion caused by the channel carrier depletion, thereby to prevent the device from the voltage breakdown near drain junction. Although it is necessary to arrange the first gate electrode at the position adjoining the source side from advantageous manufacturing point of view, said adjoining is not difficult in the usual fabrication technique. On the other hand, the second gate electrode should also be necessarily adjoined with the drain side, but it is not necessary to align said electrode with the right edge of the first gate electrode near source side. These facts mentioned above result in obtaining advantages such that there is freedom with respect to photoetching of the gate electrode portion. Even when a relatively large geometrical dimension of the device is adopted, the effective channel length $L_1$ of the MRIS transistor can be made smaller than the total length of the channel L by applying a sufficiently large voltage to the second gate, whereby it is possible to make an MRIS transistor having an effective channel length $L_1 = 1\mu$ or so, and which has a high transconductance and an improved high frequency characteristics. An example of a linear gate voltage distribution type MRIS transistor having a particular structure will be described in the following. In this example as is shown in FIG. 5 (*a*), the drain side edge of first gate electrode 1*a* corresponds to the region up to the portion being coincident with the end of the source 5, the source side edge of the second gate 2 extends to the end of the drain 6; that is, almost whole channel has a state controlled by means of a resistive layer 3 provided between two gates. According to this structure, since there is no particular point in the channel, the drain current $I_D$ can be represented, according to the following equation, as the function of the first gate voltage $V_{G1}$, second gate voltage $V_{G2}$ and drain voltage $V_D$.

$$\frac{I_D L}{z\mu C_O} = (V_{G2} - V_{G1}) \left\{ (V_{G1} - V_{th}) \frac{(e^R - 1)}{(e^R - 1 - R)} - \frac{(V_{G2} - V_{G1})}{(e^R - 1 - R)} \right\}$$

where $R = (V_D/I_D)(z\mu C_O/L)\,(V_{G2} - V_{G1})$
and $z$ = width of the channel.

In the device mentioned above, potential distribution in the channel can be represented by the following equation (2)

$$Y = \frac{L}{(V_{G2} - V_{G1})} \left\{ e^{PV(y)} (V_{G1} - V_{th} - \frac{1}{P} + V_{(y)} + \frac{1}{P} - V_{G1} - V_{th} \right\} \qquad (2)$$

where $P^{-1} = (I_D/zuC_0) \cdot (L/V_{G2} - V_{G1})$.

Figure 6:
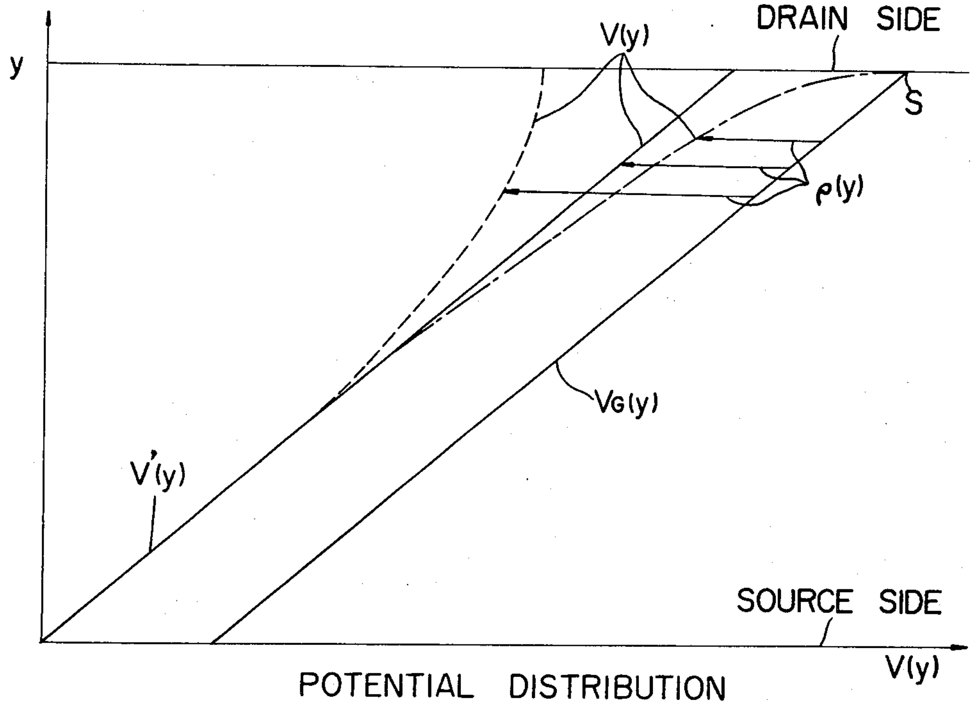
FIG. 6 is a characteristic diagram for showing mutual relation between a potential distribution in the channel and a gate potential distribution.

The results of the above calculation are shown in FIG. 6. As clear from FIG. 6, the potential distribution V(y) in the channel can be changed by varying the gate voltages $V_{G1}$ and $V_{G2}$. In FIG. 6; point S corresponds to the saturation case, and $\rho(y)$, V(y), V'(y), and $V_G(y)$ represent, respectively, carrier charge distribution in the channel, potential distribution in the channel, linear potential distribution at the portion near the source in the channel $$\left( V'(y) = \frac{V_{G2} - V_{G1}}{L} y \right)$$

and distributed gate voltage. Sometimes, there is a case, in which the potential in the channel is linearly increased toward the drain side. For this purpose, current level is to be taken so as to satisfy the following equation.

$$P^{-1} = (I_D/2\mu C_O)\,(L/V_{G2} - V_{G1}) = V_{G1} - V_{th}$$

In this case, potential distribution in the channel becomes linearly increasing as follows.

$$V(y) = (V_{G2} - V_{G1}/L)\,y$$

Furthermore, there is another case, in which any saturation phenomenon cannot be generated even when a relatively large drain voltage is applied for, differing from the case of conventional MIS transistor. It is easily understood that the just said case occurs when a condition of $V_{G2} \gg V_{G1}$ is satisfied. Accordingly, if the structure of the example of FIG. 2 according to the invention is used, it becomes possible to apply a uniform high electric field to the inversion layer of the semiconductor surface, said application having been impossible in the conventional MIS transistor, and moreover current carrier concentration becomes constant irrespective of positions of the channel portions, as shown in FIGS. 5(*b*) and 5(*c*) in which $V(y)$ and $V_G(y)$ represent respectively, potential distribution in the channel and gate voltage distribution. These advantages cannot be expected in the conventional MIS transistor in which saturation region due to current carrier depletion is produced in the vicinity of the drain. By adopting the structure according to the invention, measurement of the surface carrier mobility at the inversion layer of the semiconductor surface can be made possible at the high uniform surface electric field; and furthermore it becomes possible to obtain a high electric field avalanche phenomenon at the inversion layer of the semiconductor surface or current oscillation phenomenon due to high electric field effect of surface carrier and thereby to control said phenomena by means of two gate voltages $V_{G1}$ and $V_{G2}$.

FIG. 7 relates to an example of a new delay element to which principle of the invention is applied for. In FIG. 7, a bias source B and a resistor R forms a bias circuit which is designed so as to close the channel portion near the drain until a transmitted signal is transfered to the second gate. Structure in FIG. 7 is similar to that in FIG. 5(*a*), but in the case of FIG. 7 the resistive layer 3 and insulating layer 4 are suitably selected so that the portion on the semiconductor is formed as a distributed R. C. delay network and a signal can be fed from the first gate electrode 1*a*. This signal propagates along R. C. network on the semiconductor, thereby to change potential of the second gate after a delay time. Now, let it be considered that the signal has arrived to the second gate electrode 2. Prior to said arrival resistance of the channel portion near the drain is high, but upon said arrival said channel portion is opened, so that change of output at the drain is obtained with a delay corresponding to period of time from entering of an input signal into the first gate electrode 1a to arrival of said signal to the second gate electrode 2 in the R.C. network.

FIG. 8 relates to an example of a MRIS transistor type amplifier having as its load a MIS transistor. In FIG. 8, $V_{DD}$, $V_{in}$ and $V_{out}$ represent, respectively, drain supplying voltage, input first gate voltage and output voltage. In the structure shown in FIG. 8, although it is almost same as that of FIG. 2, the bias of the second gate is changed by AVC signal bias and when a feedback voltage AVC from outside circuit is applied to the second gate $G_1$, transconductance of the MRIS transistor is varied in accordance with the potential between the first and second gate electrodes in the MRIS transistor, so that in the MRIS transistor amplifier having as its load a MIS transistor as shown in FIG. 8(*b*), the input and output characteristics of said amplifier are varied on their slopes in accordance with the effective channel length of the MRIS transistor. That is, ratio between the channel lengths in two transistor regions $L_1$ and $L - L_1$ is varied in accordance with AVC voltage. The amplifier consisting of two conventional MIS transistors which are connected in series has only a certain constant gain; but when the driver transistor is replaced by the MRIS transistor as in this case, channel length of the driver transistor is really changed upon arrival of AVC voltage to the second gate electrode, whereby ratio of the channel length in two transistor regions is varied, thus causing variation of gain of the amplifier.

Figure 9:
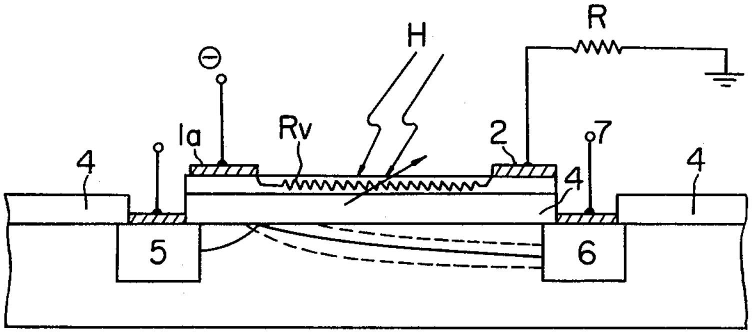
FIG. 9 (*a*) is a schematic side view, in section, showing structure of a MRIS transistor according to the invention, said transistor being provided as its resistive layer with a photo conductive resistance layer.
Figure 9:
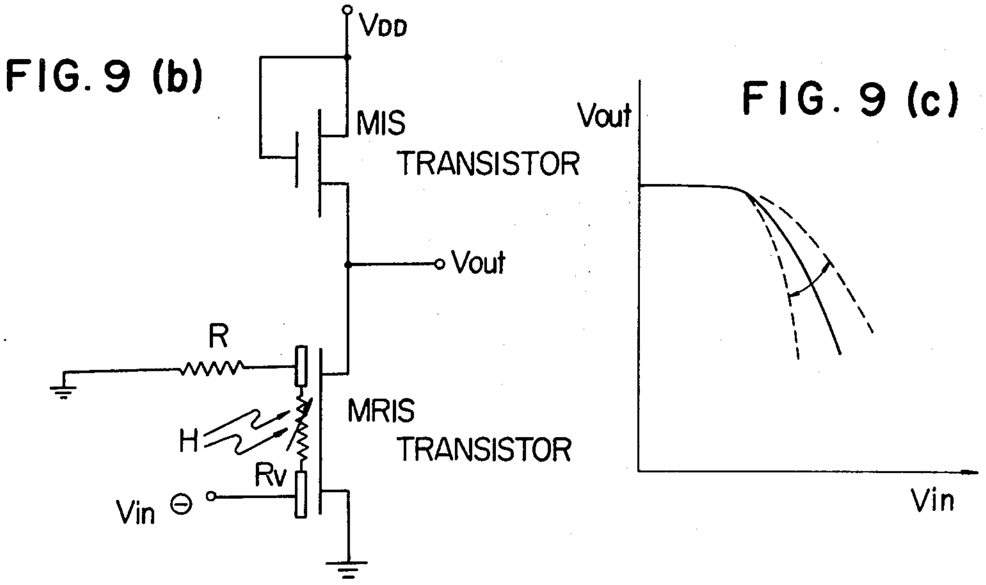

In FIG. 9, there is shown an example, in which a photoconductive variable resistor is used as the half conducting layer, and in which the characters R, $R_V$ and H represents, respectively, a bias resistor, a photosensitive variable resistor, and a light or radiation ray. In the example of FIG. 9, its structure is almost same as that of FIG. 2 as shown in FIG. 9(*a*) in which the same numbers as those in FIG. 2 are designated by the same numerals, but a photosensitive variable resistor $R_V$ is used as resistive or half conducting layer, whereby variation of gate voltage distribution due to a light input is utilized. In this example of FIG. 9, such MRIS transistor amplifier having as its load a MIS transistor as shown in FIG. 8 can be used as a practical circuit. Equivalent circuit of the amplifier is shown in FIG. 9(*b*), and input and output characteristics thereof are shown in FIG. 9(*c*). If there is not any light input, amplification factor of the input and output characteristics shown in FIG. 9(*c*) is constant, but if a light input is applied to the element, resistance of the photoconductive variable resistor $R_V$ is varied in accordance with magnitude of the input, whereby the gate voltage distribution is varied, thus causing variation of the real channel length of the MRIS transistor. Accordingly, if the device is considered as an amplifier, effective channel length of the MRIS transistors which are connected in series with a MIS transistor varies, so that gain of the amplifier also is changed as shown by arrow in FIG. 9(*c*) in accordance with a light input.

As described above in connection with FIGS. 1 to 9, according to the invention, functional ability of the conventional MIS transistor is further increased thereby to broaden its application fields and to cause easy fabrication of the semiconductor devices, thus causing economical advantage. Particularly, the invention can be effectively applied to an amplifier consisting of high frequency surface electric-field effect type transistor, a high speed switching circuit, and a modulation circuits in a mixer, and A.G.C. circuit in which the element of the invention is utilized as a high frequency tetrode.

The concept of the invention mentioned above can also be effectively applied to surface electric-field effect type semiconductor devices, in which multiple ability of the device is increased by utilizing mutual cooperation between the semiconductor and an input ray such as light ray, radiation ray or corpuscular beam. Examples of said application are shown in FIGS. 10 to 15.

Figure 10:
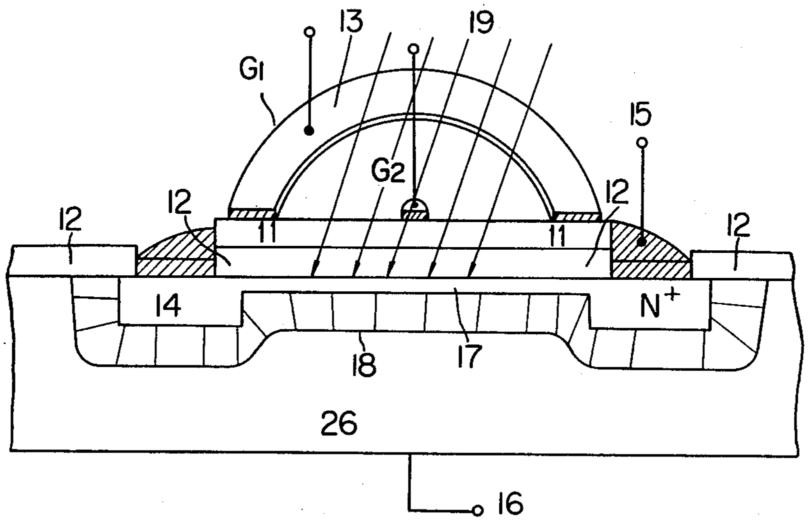
FIG. 10 is a schematic side view, in section, of a gate modulation type light detecting device according to the invention.

FIG. 10 relates to a light detecting device capable of carrying out any gate modulation, said device comprises an insulating layer 12 transparent resistive or half conducting layer 11 consisting of a material capable of passing any input ray therethrough, gate electrodes 13 ($G_1$ or $G_2$) for controlling surface potential of the semiconductor, a semiconductor bulk 26, a highly doped region 14 contacting through a low electric resistance with the inversion layer 17 beneath the surface of the semiconductor, an input terminal 15 of the said highly doped region, a terminal 16 joined with said semiconductor bulk of substrate, a depletion layer 18, and an input ray such as light ray or radiation ray 19.

In the structure of FIG. 10, if a bias is applied to the gate terminal 13 while maintaining a reverse-bias at the PN junction of the terminals 15 and 16 so that the inversion layer 17 is produced, the highly doped region 14 and the inversion layer 17 are electrically connected to each other through a low resistance, and furthermore it is established that a reverse bias is being applied to the depletion layer 18, because the bias of the terminals 15 and 16 is common to the electric-field induced inversion layer. If in the condition mentioned just above a light ray or radiation ray 19 is applied to the device as shown in FIG. 10, photo-current due to said input ray is generated along the depletion layer 18, so that said photo-current can be led out from the terminals 15 and 16, whereby a light detecting element capable of the gate modulation can be obtained. In this device, an electric-field induced junction is produced within thickness of less than 1 micron from the surface, so that a junction can be advantageously produced at the portion where is very near the semiconductor surface in comparison with the case of the metallurgical PN junction formed by diffusion or epitaxial technique. Accordingly, the input ray can effectively act upon the depletion layer 18 without being absorbed on the way, whereby new channel carrier is newly generated thereby to produce an photo electromotive force.

Figure 11:
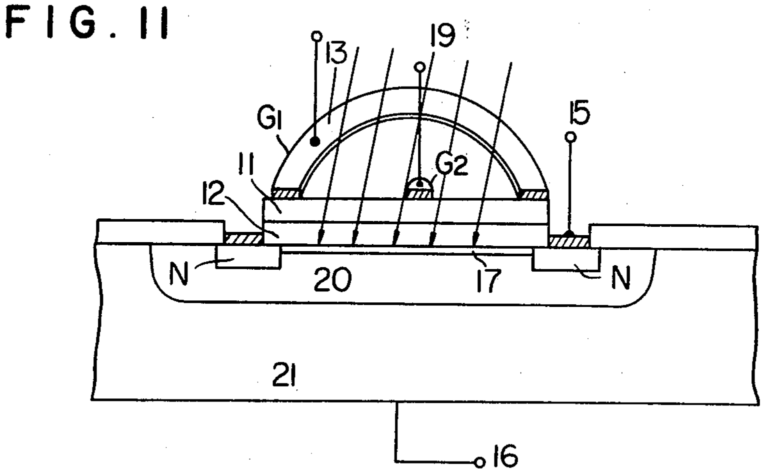
FIG. 11 is a schematic side view, in section, of a surface induced junction type photo-transistor capable of gate modulation according to the invention.

FIG. 11 relates to a photo-transistor to which the operation of the semiconductor device illustrated in FIG. 10 is applied for. Different points of the structure shown in FIG. 11 from that shown in FIG. 10 reside in that a metallurgical PN junction is formed at the position beneath the electric-field induced junction by means of diffusion or epitaxial technique by which P layer 20 and N layer 21 are added, whereby fabrication of a photo-transistor capable of gate modulation which utilize a surface induced junction is made possible. The newly formed P layer 20 and N layer 21 are equivalent to the hook structure concept of the conventional photo-transistor. In FIG. 11, the P layer 20 is floating, but the current gain of the photo-transistor will be represented by the following equation according to function of the forward biased P - N junction $$\alpha = 1 + (L_p/F) \cdot (\rho pc/\rho nc)$$

In this equation, if let it be assumed that F(thickness of the P layer) = 0.01 cm, $L_p$(diffusion length of hole)=0.1 cm, $\rho pc$ (specific resistance of the P layer)=$10\Omega^{cm}$, and $\rho nc$ (specific resistance of the N layer)=$1\Omega$cm, then $\alpha^* \approx$ 1Ω100, whereby it becomes clear that current gain is increased to 100 times by the effect of the hook structure and moreover gate modulation can be attained as in the case of the structure of FIG. 10, thus causing possibility of various applications thereof.

Figure 12A:
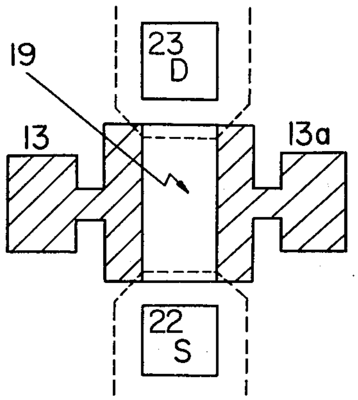
FIG. 12 (*a*) and 12 (*b*) are a schematic plan view and a schematic perspecting view of a transparent gate type MRIS transistor according to the invention, respectively.
Figure 12B:
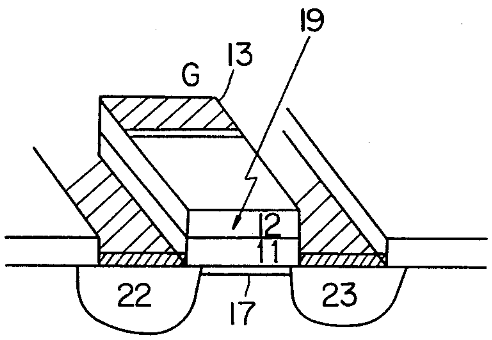

In FIG. 12, there is shown a MRIS transistor, in which gate portion of the conventional MIS transistor is replaced by transparent insulating layer and resistive layer. In FIG. 12, the numerals 11, 12, 13 — designate the same members as those of the device shown in FIG. 10 and the numerals 22 and 23 represent, respectively, highly doped portion of the source and highly doped portion of the drain. When a light is radiated onto the transparent gate, MRIS gate capacitance is varied owing to said light in the channel formed on the semiconductor surface. In this case, said variation is increased in response to the light input, whereby current between the source and drain is increased. FIG. 12(*a*) is a plan view and FIG. 12(*b*) is a schematic, perspective view. According to the structure of the device shown in FIG. 12, introduction of light input to the gate resistive portion of the MRIS transistor becomes possible, thus causing addition of a new ability to the conventional MIS transistor since the said introduction has been regarded to be impossible in the case of conventional MIS transistor.

Figure 13:
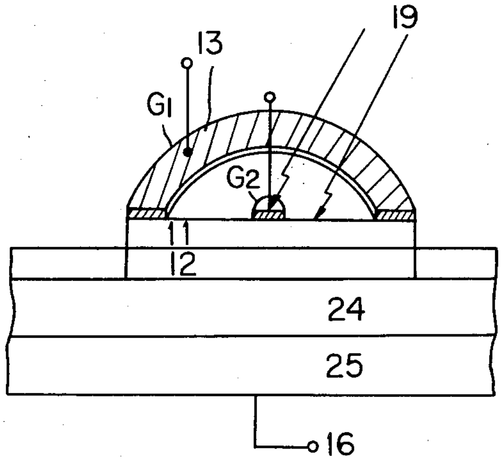
FIG. 13 is a schematic side view, in section, of a variable capacitance type MRIS transistor device utilizing light input.

FIG. 13 relates to MRIS type variable capacitance device, in which a transparent gate is used at the gate portion of the conventional MIS variable capacitance element and light input is utilized, and in which the numerals 24 and 25 represent, respectively, N layer and $N^+$ layer. The structure of FIG. 13 has an advantage such that capacitance change of surface induced junction portion which is the most near the surface, said change being caused by light input, gate G1 and G2 can be effectively utilized without causing any loss due to absorption of semiconductor substrate.

Figure 14:
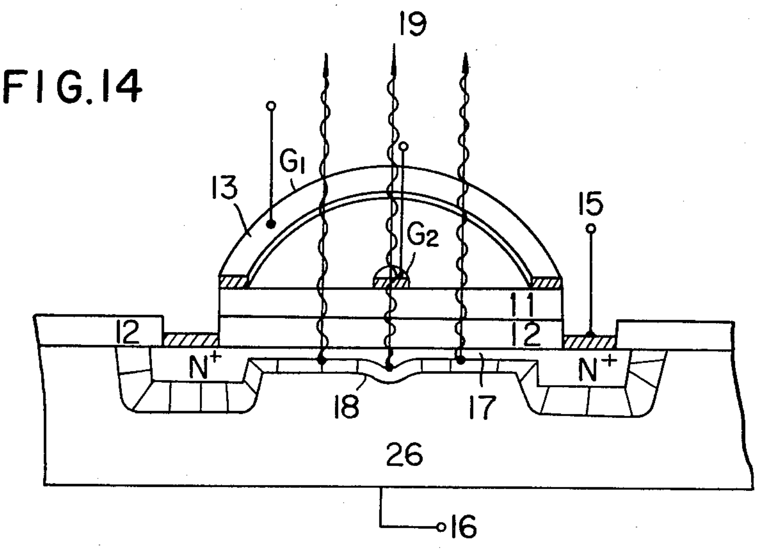
FIG. 14 is a schematic side view, in section, of a surface induced junction type luminescent device according to the invention.
Figure 15:
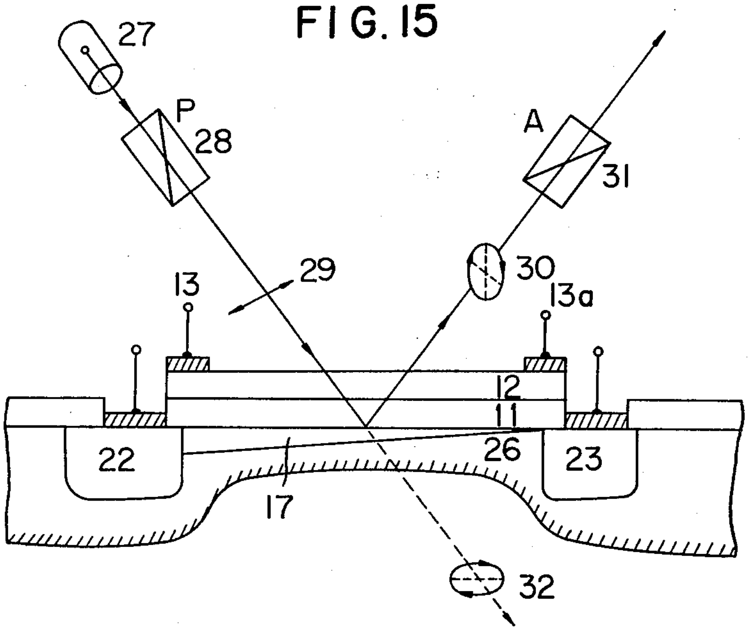
FIG. 15 is a schematic side view, in section, of a MRIS transistor type surface light modulator according to the invention.

FIG. 14 relates to an example of a surface induced junction type luminescent device, in which a transparent gate of which the potential distribution are changed by G1 and G2 is used. The structure of the device of FIG. 14 is substantially same as that of the element shown in FIG. 10, but is remarkably different in its function from that of the device of FIG. 10. That is, when a forward bias is applied to the terminals 15 and 16 of the PN junction and the gates bias $V_{G1}$ and $V_{G2}$ are also supplied suitably thereby to cause introduction of channel carriers and this current carrier is introduced to a inversion layer 17, recombination of the current carrier occurs at the depletion layer portion of the surface electric-field induced junction, whereby a light is generated from the surface depletion layer of the channel and said generated light 19 is radiated toward direction perpendicular to the semiconductor surface, as clearly shown in FIG. 14. In this case, for the purpose of effectively causing the recombination of the current carrier at portion of the electric-field induced junction, it is necessary to apply the deep bias to the terminals of $V_{G1}$ and $V_{G2}$ adjoined at the transparent gate thereby to make the inversion layer of the semiconductor surface to have the same effect as that of the highly doped semiconductor. The device shown in FIG. 14 is provided with four terminals, so that said device has an advantage such that luminescent phenomenon at surface electric-field induced junction can be modulated by any gate signal, said advantage having not been obtained by the conventional MIS device. Furthermore, since the gate of said device is of insulating gate type, any electric power is scarcely required for the modulation due to a signal, and since the device is extremely near the semiconductor surface in comparison with the case of other light-emitting device comprising the metallurgical PN junction and has a surface luminescent property, application freedom of said device is remarkably large. FIG. 15 is a schematic view showing possibility of manufacturing a surface electric-field effect type light modulator by utilizing a transparent gate of MRIS Structure. As shown in FIG. 15, the device comprises a transparent gate electric-field effect type transistor manufactured as described already; a light source 27 for emitting a light toward the transparent gate of said transistor; and a light polarizer 28 provided between said light source and transparent gate, said polarizer acting to produce a plane electromagnetic wave and to cause incidence of the light of having the state shown by arrow directions 29 into the transparent gate. In this case, since the resistive or half conducting layer 12 and insulating layer 11 are transparent with respect to light, the light emitted from the light source 27 arrives upon the semiconductor surface without causing any loss and interacts with the current carrier existing in the inversion layer 17 on the semiconductor surface, whereby a part of the incident light is reflected out as shown by numeral 30 and another part of said light transmits through the semiconductor as shown by numeral 32. When light beam and current carrier are caused to be mutually interacted, both of the light beams 30 and 32 become elliptically polarized light as indicated at 30 and 32, because amplitude and phase of the linearly polarized light of input are changed by the surface induced junction. Accordingly, if a component of said elliptically polarized light input is viewed through a light 31, output of the light beam passed through the light analyzer 31, can be modulated by any gate signal of G1 and G2 because current carrier density of the channel is changed by a signal applied to the gate electrodes G1 and G2. Almost all of the conventional light modulators utilize materials except semiconductor, so that control caused by a third electrode is very difficult. Furthermore, in general, in the conventional light modulators, light polarization cannot be varied unless a high electric voltage is applied for. On the other hand, an opto-electronic light modulator utilizing optical effect of the depletion layer according to conventional metallurgical PN junction has been proposed.

However, in the light modulators illustrated in FIG. 15 according to the invention, light modulation by a third electrode, that is, gate electrodes G1 and G2 can be made possible and efficient modulation is obtained because of adoption of surface electric-field induced junction and of interaction between light and current surface carrier, so that the light modulators according to the invention has a remarkable advantage such that loss is extremely low in comparison with the conventional modulators. Accordingly, the above-mentioned devices as illustrated in FIGS. 11 to 15, in which effect of light input imparted to channel junction in the surface of surface electric-field induced junction device is controlled by means of a transparent gate voltage distribution determined by G1 and G2, can be effectively applied to light detectors, image detectors, controlling a surface light emitting device by the gates G1 and G2, light MRIS modulators, and the like.

What we claim is:

1. An insulated gate type field-effect device comprising: a wafer of monocrystalline semiconductor having a first conductivity type; a source and a drain each of which has a region in said monocrystalline semiconductor, said region having a second conductivity type opposite to said first conductivity type; terminals secured on said source and drain through metallic materials used for electrodes, respectively; an insulating layer overlying on a substantial portion of said semiconductor wafer; a resistive layer attached on said insulating layer at the position between said source and said drain; and electrically electroconductive parts which form a first gate electrode and a second gate electrode, respectively, and which are provided on said insulating layer and resistive layer in parallel with a current flowing direction of a surface channel; one side of said first gate electrode overlapping with an end of said source with the other end thereof terminating in the midway of the surface channel between said source and said drain, one end of said second gate electrode overlapping with an end of said drain with the other end thereof being spaced from said first gate electrode while leaving said resistive layer there-between, said first gate, said second gate and a portion between said first and second gates being respectively insulated from said source, said drain and said surface channel by said insulating layer, means for applying to said first and second gates a gate voltage through said resistive layer so that a voltage drop direction in the gate voltage distribution is the same as that of a surface channel current flowing through the channel beneath said insulating layer.

2. A semiconductor field effect tetrode as claimed in claim 1 adapted for utilization as a high frequency field effect tetrode, comprising; means for applying a second gate voltage $V_{G2}$ of a value much greater than a first gate voltage $V_{G1}$ in case of high frequency device operation, said insulation gate type field-effect tetrode device being operative by a drain voltage $V_{DS}$ applied thereto within a range so calculated that a MIS transistor can be saturated by said first gate voltage which is defined by $V_{G1}$, said second gate voltage being variable within a range such that $V_{G2}$ is much greater than $V_{G1}$ to thereby modulate said high-frequency transistor, and an effective channel length of said tetrode being made to be changed by variation of $V_{G2}$ to thereby change the gain of said tetrode.

3. An insulated gate type field-effect tetrode device as is claimed in claim 1 which is adapted to apply a uniform high electric field in a surface channel direction, said device including said resistive layer attached on said insulating layer at the position between said source and said drain; an electrode member forming the first gate, an electrode member forming the second gate, and a distributed gate member consisting of said resistive layer between said first gate and said second gate, and wherein said gate members are arranged on said insulating layer and resistive layer in parallel with a direction in which a surface channel current flows; said first gate member being placed above the source region through said insulating layer and resistive layer, one end of said first gate being substantially above the channel junction part of an end of said source, said second gate being placed above the drain region through said insulating layer and resistive layer, one end of said second gate being substantially above the channel junction part of an end of said drain, a portion over the surface channel portion between said source and said drain substantially comprising said insulating layer and said resistive layer and said first gate member and second gate member being substantially offset from the channel portion, the width and length of said channel being constant, said distributed resistive gate located between said first gate and said second gate being constant in length and width, means for applying through said first and second gates a voltage to said resistive layer so that the direction of the voltage drop of said resistive layer is made to be in parallel with that of a current flowing through the surface channel beneath said insulating layer, a potential distribution in the channel being made to be changed by the first gate voltage $V_{G1}$, the second gate voltage $V_{G2}$ and a drain voltage $V_D$, and said device having an operating point at which the distribution potential of the channel linearly increases from said source to said drain with a proper $V_D$ under the gate voltages $V_{G1}$ and $V_{G2}$, said operating point causing application of a certain constant voltage difference across said insulating layer at any point of the channel due to the voltage difference effect between the voltage distribution of the distributed gate, where said voltage distribution is linearly changed on the insulating layer, and the linearly changing potential drop in said channel between said source and said drain, whereby a carrier distribution in the channel is made to be constant and uniform from the source to the drain.

4. A device as claimed in claim 3, in which a constant, uniform and high electric field in said surface channel is formed in a state that a channel carrier is properly induced, to thereby cause an avalanche phenomenon due to the uniform and high electric field and an oscillation phenomena of a channel current due to the high electric field along over the whole region of the surface channel between the source and the drain, these phenomena being controlled by said first gate and said second gate.

5. A semiconductor device as claimed in claim 1, in which a distributed network of resistance and capacitance is formed by said resistive layer and said insulating layer disposed between the first and second gates and said insulating layer provided beneath said resistive layer, and said first gate is used as an input electrode for a signal so as to transmit said signal through said R-C distributed network on the semiconductor toward said second gate which is adjacent to the drain, said second gate being kept off until a delay signal arrives therein whereby no signal is obtained at the output terminal of the drain, while said second gate is put into an on state upon arrival of the signal through said network, whereby an amplified output at the drain terminal is obtained with a time delay from the entering of said input signal.

6. A semiconductor device as claimed in claim 1, in which the drain output terminal comprises a MIS transistor as its load connected thereto and the second gate is connected so as to be supplied with a feedback signal to thereby vary the effective channel length of the MRIS tetrode device, whereby amplification gain of a signal applied from the first gate is varied at the drain output terminal.

7. A MRIS tetrode device having Metal-Resistive-layer-Insulator-Semiconductor structure as claimed in claim 1, which operates as an amplifier having a MIS transistor as its load and in which a photo-variable resistor the resistance of which is varied by light radiation thereon is used as the resistive layer provided above the insulating layer at the position between the first gate and the second gate, and a MIS transistor is connected to an output terminal of the drain as the load of the device, whereby modulation of amplification gain due to the first and second gate electrodes is attained, the voltage drop due to bias applied between the first and second gates by a light input is made to vary, and the effective channel length of the MRIS tetrode is made to vary by radiation of light input to thereby vary the ratio of the channel length of said MIS transistor and channel length of the MRIS tetrode, thus causing variation of the input and output characteristics of said amplifier.

8. An insulated gate type field-effect tetrode device as claimed in claim 1, in which the resistive layer and insulating layer provided between the first and second gate electrodes are made to be transparent with respect to incident light radiated thereto, whereby capacitance of the MIS gate in the surface channel is varied in response to input light and the amount of the minority carrier in the surface channel is varied to thereby vary the drain current.

9. A device as claimed in claim 1, in which the insulating layer and the resistive layer provided on said semiconductor surface are made of a light transparent material, and an input light ray is applied obliquely through a polarizer as a linearly polarized light ray to the transparent gate surface formed by said layers, said polarized light ray carrying out mutual interaction with the surface inversion carrier provided on the semiconductor surface or with surface electric field induced depletion layer beneath the surface inversion layer whereby a part of said light ray is reflected and the other part is made to transmit through the wafer, amplitudes and phases of said reflected light ray and said transmitted light ray being made to be different from those of the input light ray due to their polarization actions, the degree of said change of polarization being varied according to bias applied to the first and second gate electrodes, and the input light carrying out mutual interaction with the surface carrier between the drain region and the source region.

* * * * *